United States Patent
Heintz et al.

(10) Patent No.: US 12,203,164 B2
(45) Date of Patent: Jan. 21, 2025

(54) MATERIAL DEPOSITION APPARATUS, METHOD OF DEPOSITING MATERIAL ON A SUBSTRATE, AND MATERIAL DEPOSITION SYSTEM

(71) Applicant: Applied Materials, Inc., Santa Clara, CA (US)

(72) Inventors: Tamara Heintz, Mömbris (DE); Stefan Bangert, Steinau (DE); Suresh Manikkoth Kollarath, Bangalore (IN); Ramgopal Chakkaravarthy Ramasamy, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/717,642

(22) Filed: Apr. 11, 2022

(65) Prior Publication Data

US 2022/0341031 A1    Oct. 27, 2022

Related U.S. Application Data

(60) Provisional application No. 63/177,491, filed on Apr. 21, 2021.

(51) Int. Cl.
*C23C 14/56* (2006.01)
*C23C 14/24* (2006.01)
*C23C 14/54* (2006.01)

(52) U.S. Cl.
CPC ........... *C23C 14/541* (2013.01); *C23C 14/24* (2013.01); *C23C 14/562* (2013.01)

(58) Field of Classification Search
CPC ................ C23C 14/56–562; C23C 16/54–545
(Continued)

(56) References Cited

U.S. PATENT DOCUMENTS 5,076,203 A    12/1991    Vaidya et al.
9,333,525 B2    5/2016    Ries et al.
(Continued)

FOREIGN PATENT DOCUMENTS

CN    103782201 A    5/2014
JP    01152262 A    6/1989
(Continued)

OTHER PUBLICATIONS

Office Action for Taiwan Application No. 111115016 (44019464TW01) dated Jan. 5, 2023.
(Continued)

*Primary Examiner* — Aiden Lee
(74) *Attorney, Agent, or Firm* — Patterson + Sheridan, LLP

(57) ABSTRACT

A material deposition apparatus for depositing an evaporated material onto a substrate is provided. The material deposition apparatus includes a processing drum having a cooler configured to control a substrate temperature during processing of a substrate on the processing drum; a roller guiding the substrate towards the processing drum; a first heater assembly positioned to heat the substrate in a free-span area between the roller and the processing drum; a second heater assembly positioned to heat the substrate while being supported on the processing drum; at least one deposition source provided along a substrate transport path downstream of the second heater assembly; a substrate speed sensor providing a speed signal correlating with a substrate transportation speed; and a controller having an input for the speed signal configured to control at least the first heater assembly.

16 Claims, 3 Drawing Sheets

(58) Field of Classification Search
USPC .......................................................... 118/718
See application file for complete search history.

(56) References Cited

U.S. PATENT DOCUMENTS

| | | | |
|---|---|---|---|
| 9,856,554 B2 | 1/2018 | Lotz | |
| 10,648,072 B2 | 5/2020 | Ries et al. | |
| 2009/0110809 A1* | 4/2009 | Buschbeck | C23C 14/562 |
| | | | 226/7 |
| 2009/0272322 A1 | 11/2009 | Fujinami et al. | |
| 2014/0216924 A1* | 8/2014 | Lotz | G02B 1/16 |
| | | | 204/298.03 |
| 2015/0158048 A1 | 6/2015 | Ries et al. | |
| 2017/0062202 A1* | 3/2017 | Masuda | C23C 16/505 |
| 2017/0152593 A1* | 6/2017 | Ries | C23C 16/54 |
| 2018/0158973 A1* | 6/2018 | Farshchi | H01L 31/0322 |
| 2019/0284678 A1* | 9/2019 | Lifka | C23C 14/562 |
| 2021/0230742 A1 | 7/2021 | Okami | |

FOREIGN PATENT DOCUMENTS

| | | |
|---|---|---|
| JP | 2004315861 A | 11/2004 |
| JP | 2014532204 A | 12/2014 |
| JP | 2017502172 A | 1/2017 |
| JP | 2017509797 A | 4/2017 |
| JP | 2019203171 A | 11/2019 |
| KR | 20100091984 A | 8/2010 |
| KR | 101061731 B1 | 9/2011 |
| KR | 20160087910 A | 7/2016 |
| KR | 20160142363 A | 12/2016 |
| KR | 20190039139 A | 4/2019 |
| TW | 201533257 A | 9/2015 |
| WO | 2009053289 A1 | 4/2009 |
| WO | 2013/034181 A1 | 3/2013 |
| WO | 2015/086602 A1 | 6/2015 |
| WO | 2015149849 A1 | 10/2015 |
| WO | 2018/001523 A1 | 1/2018 |
| WO | 2018016947 A1 | 1/2018 |
| WO | 2018199169 A1 | 11/2018 |
| WO | 2019225057 A1 | 11/2019 |
| WO | 2020078557 A1 | 4/2020 |

OTHER PUBLICATIONS

Search Report for Taiwan Application No. 111115016 (44019464TW01) dated Dec. 8, 2022.
International Search Report and Written Opinion for International Application No. PCT/US2022/024225 dated Aug. 3, 2022.
Office Action for Korean Application No. 10-2023-7039193 dated Jul. 8, 2024.
Office Action for Japanese Application No. 2023-564018 (APPM/44019464JP01) dated Sep. 3, 2024.

* cited by examiner

MATERIAL DEPOSITION APPARATUS, METHOD OF DEPOSITING MATERIAL ON A SUBSTRATE, AND MATERIAL DEPOSITION SYSTEM

FIELD

Embodiments of the present disclosure relate to substrate coating, particularly by thermal evaporation in a vacuum chamber. Embodiments of the present disclosure further relate to material deposition of evaporated material onto a substrate, particularly for manufacturing of batteries. Embodiments of the present disclosure relate to one or more heating assemblies for a material deposition apparatus for pre-heating a substrate, a method for depositing material on a substrate, and a material deposition system.

BACKGROUND

Various techniques for deposition on a substrate, for example, chemical vapor deposition (CVD) and physical vapor deposition (PVD) are known. For deposition at high deposition rates, thermal evaporation may be used as a PVD process. For thermal evaporation, a source material is heated up to produce a vapor that may be deposited, for example, on a substrate. Increasing the temperature of the heated source material increases the vapor concentration and can facilitate high deposition rates. The temperature for achieving high deposition rates depends on the source material physical properties, e.g. vapor pressure as a function of temperature, and substrate physical limits, e.g. melting point.

The deposition of a metal, e.g. lithium, on a flexible substrate, e.g. on a graphite foil or a copper substrate, by evaporation may be used for the manufacture of batteries, such as Li-batteries. For example, a lithium layer may be deposited on a thin flexible substrate for producing the anode of a battery. After assembly of the anode layer stack and the cathode layer stack, optionally with an electrolyte and/or separator therebetween, the manufactured layer arrangement may be rolled or otherwise stacked to produce the Li-battery.

Thermal expansion during the substrate processing may result in wrinkles in the substrate, for example, a foil or web. Spreading of the foil and particularly sudden spreading of the foil may introduce wrinkles on the foil. The wrinkles may deteriorate the quality of the deposited layer or layers.

It is thus beneficial, to provide an improved material deposition apparatus, an improved deposition method and an improved processing system to at least partially overcome the above problems.

SUMMARY

In light of the above, a material deposition apparatus, a method of depositing material on a substrate, and a material deposition system according to the independent claims are provided. Further features, aspects, details, and implementations are described in the detailed specification, the drawings, and the dependent claims.

According to an embodiment, a material deposition apparatus for depositing an evaporated material onto a substrate is provided. The material deposition apparatus includes a processing drum having a cooler configured to control a substrate temperature during processing of a substrate on the processing drum; a roller guiding the substrate towards the processing drum; a first heater assembly positioned to heat the substrate in a free-span area between the roller and the processing drum; a second heater assembly positioned to heat the substrate while being supported on the processing drum; at least one deposition source provided along a substrate transport path downstream of the second heater assembly; a substrate speed sensor providing a speed signal correlating with a substrate transportation speed; and a controller having an input for the speed signal configured to control at least the first heater assembly.

According to an embodiment, a method of depositing an evaporated material onto a substrate is provided. The method includes guiding the substrate from a roller towards a processing drum; measuring a substrate speed signal; and heating the substrate with a first heater assembly between the roller and the processing drum dependent on the substrate speed signal.

According to an embodiment, a material deposition system is provided. The system includes a processing drum for supporting the substrate during processing; a substrate guiding roller upstream of the processing drum; a first heater assembly provided between the roller and the processing drum; and a controller comprising: a processor and a memory storing instructions that, when executed by the processor, cause performing a method according to embodiments of the present invention.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following.

DETAILED DESCRIPTION OF EMBODIMENTS

Figure 1:
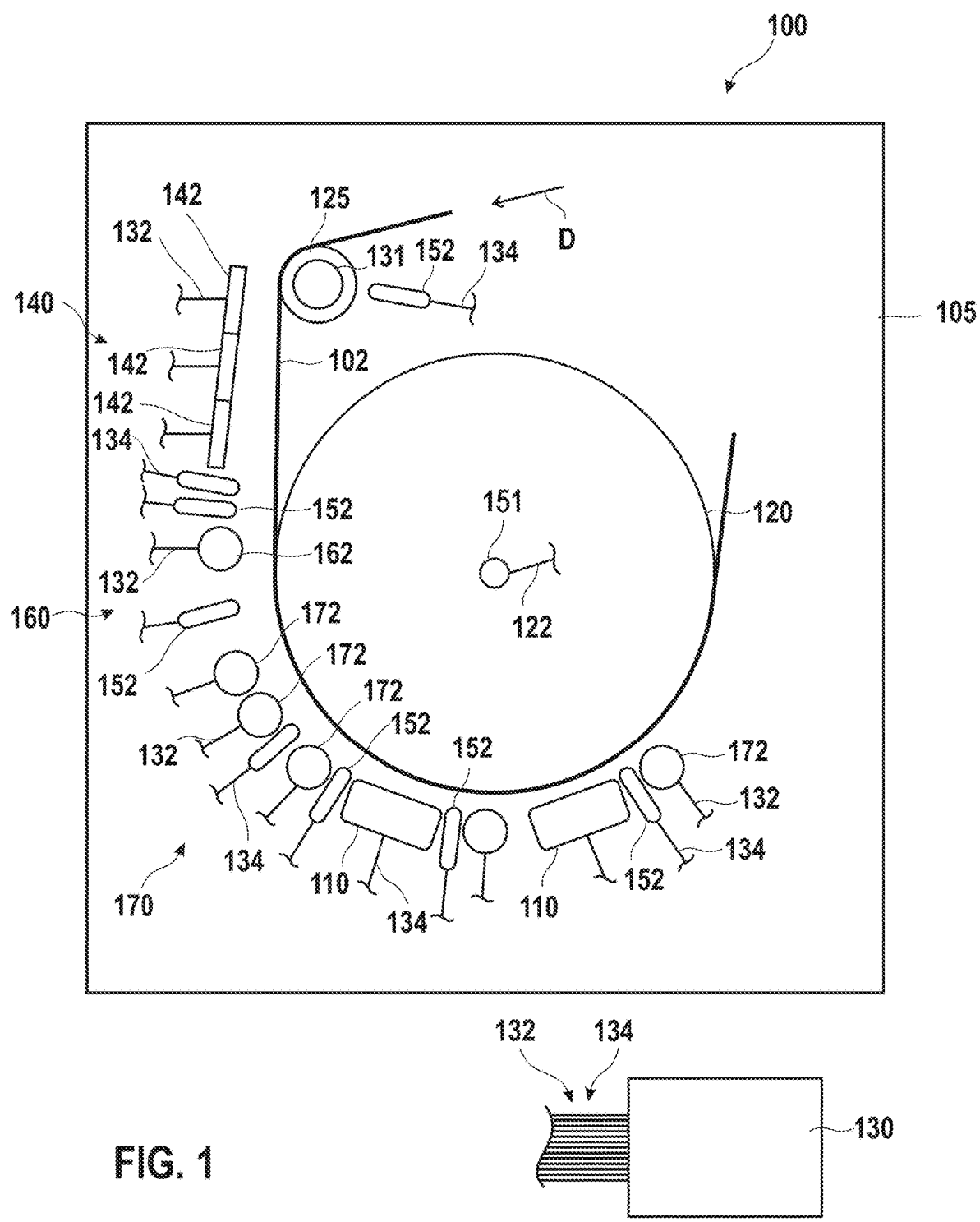
FIG. 1 shows a schematic view of a material deposition apparatus according to embodiments described herein.

Reference will now be made in detail to the various embodiments of the disclosure, one or more examples of which are illustrated in the figures. Within the following description of the drawings, the same reference numbers refer to same components. Generally, only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

The embodiments provided herein relate to thin film coating by evaporation, particularly to thin film coating in a vacuum chamber. For example, the material to be coated is heated up to a material-specific temperature to be evaporated. In general, higher evaporation rates can be provided at higher temperatures.

Embodiments of the present disclosure reduce spreading of a substrate, i.e. a flexible substrate, such as a foil or web due to heat. Wrinkles can be reduced to increase the quality of thin film deposition on the substrate. According to embodiments of the present disclosure one or more temperature control zones are provided. Particularly, a first temperature control zone such as a low power control zone is provided. A speed dependent heating of the substrate is provided in the first temperature control zone. According to some embodiments, which can be combined with other embodiments described herein, a speed dependent pre-heating of the substrate, e.g. a graphite foil, can be provided before the substrate comes into contact with a processing drum. The first temperature control zone can be provided in a free-span area. The free-span area can be a substrate guiding area between a roller adjacent to a processing drum and the processing drum.

According to an embodiment of the present disclosure, a material deposition apparatus for depositing an evaporated material onto a substrate is provided. The material deposition apparatus includes a processing drum having a cooler configured to control a substrate temperature during processing of a substrate on the processing drum, a roller guiding the substrate towards the processing drum, a first heater assembly positioned to heat the substrate in a free-span area between the roller and the processing drum, a second heater assembly positioned to heat the substrate while being supported on the processing drum, at least one deposition source provided along a substrate transport path downstream of the second heater assembly, a substrate speed sensor providing a speed signal correlating with a substrate transportation speed and a controller having an input for the speed signal configured to control at least the first heater assembly.

Further, in evaporation systems and material deposition apparatuses including an evaporator, the evaporated material will condensate on surfaces of the system components having a lower temperature than the evaporated material. For thermal coating of a substrate, the substrate includes a lower temperature such that the evaporated material may be deposited or coated onto the substrate to form a thin layer on the substrate. However, when the difference between the temperature of the substrate and the temperature of the material to be coated is large, the resulting thin layer or film may be damaged, e.g. ripped, or may produce wrinkles on its surface.

FIG. 1 exemplarily shows a material deposition apparatus according to embodiments described herein that can be combined with any other embodiment described herein. The material deposition apparatus 100 may include a vacuum chamber 105. A vacuum may be provided in the vacuum chamber. For example, the material deposition apparatus may include a vacuum pump for providing the vacuum in the vacuum chamber.

The term "vacuum" as used herein can be understood in the sense of a technical vacuum having a vacuum pressure of less than, for example, 10 mbar. Typically, the pressure in a vacuum chamber as described herein may be between $10^{-4}$ mbar and about $10^{-8}$ mbar, more typically between $10^{-4}$ mbar and $10^{-7}$ mbar, and even more typically between about $10^{-5}$ mbar and about $10^{-6}$ mbar. In some embodiments, the total pressure in the one or more vacuum chambers may range from about $10^{-4}$ mbar to about $10^{-7}$ mbar. Accordingly, the vacuum chamber can be a "vacuum deposition chamber", i.e. a vacuum chamber configured for vacuum deposition.

According to embodiments that can be combined with any other embodiment described herein, the material deposition apparatus may include a deposition source assembly. For example, the deposition source assembly can be an evaporation source assembly including one or more evaporation sources. Embodiments of the present disclosure relate to deposition sources, particularly physical vapor deposition (PVD) sources, wherein energy is transferred to the substrate by the deposition process. For high deposition rates, evaporation sources can be particularly useful. Accordingly, reference is made to evaporation sources in the following description. It is to be understood that also other deposition sources, particularly deposition sources transferring energy to the substrate, may be utilized for embodiments of the present disclosure.

The term "evaporation source assembly" as used throughout the present disclosure may be understood as an assembly, unit or apparatus that includes one or more evaporation sources. As such, the features discussed herein with respect to the evaporation source assembly may correspondingly apply to a single evaporation source also. For example, only one evaporation source may be included in the evaporation source assembly. In such instances, the evaporation source assembly may be referred to as the evaporation source. According to some embodiments, which may be combined with other embodiments described herein, two or more evaporation sources can be provided in the evaporation source assembly.

The evaporation source assembly is configured to provide evaporated material towards a substrate 102. The evaporation source assembly can be provided in the vacuum chamber 105 or can at least partially be provided in the vacuum chamber 105. The evaporation source assembly may be disposed along the substrate transportation direction (D) for providing material to the substrate.

The evaporation source assembly may include two or more evaporation sources. Two evaporation sources 110 are shown in FIG. 1. For example, the evaporation source assembly may include a first evaporation source having a first deposition area for depositing material onto the substrate and a second evaporation source having a second deposition area for depositing material onto the substrate.

According to embodiments that can be combined with any other embodiment described herein, the material deposition apparatus may include a processing drum 120. The processing drum may be configured to transport the substrate 102. The substrate 102 may be arranged around the processing drum 120. The processing drum 120 may be a coating drum as exemplarily shown in FIG. 1. The coating drum may include a curved drum surface. The processing drum may be configured to move the substrate 102 on the curved drum surface past the evaporation source 110 in a circumferential direction or substrate transport direction.

According to embodiments that can be combined with any other embodiment described herein, the evaporation source assembly may provide material to be deposited to the substrate. The evaporation source assembly may include one or more crucibles where the material to be deposited may be evaporated by providing a temperature to the material suitable to evaporate the material. For example, the material to be deposited can include, for example, metal, in particular lithium, metal alloys, and other vaporizable materials or the like which have a gaseous phase under given conditions. According to yet further embodiments, additionally or alternatively, the material may include magnesium (Mg), ytterbium (Yb) and lithium fluoride (LiF).

Further, an evaporation source of the evaporation source assembly may include a distributor. The distributor may distribute the evaporated material. The material may be provided in the distributor, for example, by the crucible being connected to the distributor via an inlet opening. The distributor may have one or more openings. Evaporated material to be deposited can exit the distributor through the openings. The source material can be deposited on the substrate 102 by a plurality of nozzles extending through the openings. In other words, the evaporation source may include one or more nozzles for providing evaporated material to the substrate. The material to be deposited may e.g. be sprayed to the substrate by the plurality of nozzles.

For example, the substrate may be a flexible web or foil, and the material deposition apparatus may be a roll-to-roll deposition apparatus. The coating drum may be a cylinder extending in a length direction perpendicular to the paper plane of FIG. 1. The processing drum may be movable, i.e. the coating drum may be rotated around a center axis. The processing drum may be moved or rotated clockwise or counterclockwise. The processing drum may change direction during deposition, e.g. when the processing drum is rotated clockwise during deposition, the rotational direction may be changed to counterclockwise and vice versa.

According to embodiments that can be combined with any other embodiment described herein, the material deposition apparatus may include a substrate provision or unwinding roll (not shown in FIG. 1) for providing an unprocessed substrate. The substrate provision or unwinding roll may be moved i.e. rotated such that the substrate may be unrolled from the substrate provision or unwinding roll. Additionally, the material deposition apparatus may include a substrate receiving roll for taking up the processed substrate after deposition of material onto the substrate has taken place. The substrate receiving roll may be moved, i.e. the substrate receiving roll may be rotated for taking up the processed substrate. The substrate receiving roll and the substrate provision or unwinding roll may be rotated in the same direction, i.e. both rolls may be rotated clockwise or the substrate provision or unwinding roll may be rotated in opposing directions, i.e. one roll may be rotated clockwise and the other roll may be rotated counterclockwise or vice versa. For example, the substrate may be "spanned" between the unwinding roll and the receiving roll and may be guided above the evaporation source assembly for receiving the evaporated material. For example, the substrate may be provided with defined and/or controlled forces. A substrate tensioner may be provided.

According to some embodiments, which can be combined with other embodiments described herein the processing drum may be a gas cushion processing drum. The gas cushion coating drum provides a cooling gas between the surface of the drum and the substrate. For example, the drum and the cooling gas can be cooled to temperatures below room temperature. Heat can be removed from the substrate to allow for higher deposition rates without damaging the thin foil or web on which the material is deposited.

For a gas cushion roller, a first subgroup of gas outlets, i.e., the open gas outlets, can be provided in a web guiding region of the processing drum. A second subgroup of gas outlets, i.e., closed gas outlets, are provided outside the web guiding region. Since gas is only emitted in the web guiding region where it is needed to form the hover cushion, no or little gas is directly emitted into a region not overlapped by the web, waste of gas may be reduced and/or a better vacuum may be maintained at lesser strain on the pump system.

According to some embodiments, which can be combined with other embodiments described herein, additionally or alternatively to the subgroups of gas outlets, the outer surface of the processing drum may be coated with a microporous surface. The microporous surface may allow for a small amount of cooling gas to flow from inside the processing drum to the surface of the processing drum. The cooling gas may form a gas cushion between the processing drum and the web or foil guided over the processing drum for material deposition thereon.

According to embodiments that can be combined with any other embodiment described herein, the substrate can be a thin substrate, e.g. a foil or web. The substrate to be coated may have a thickness of 50 µm or less, particularly 20 µm or less, or even 10 µm or less. For example, a metal foil or a flexible metal-coated foil may be coated in the vapor deposition apparatus. In some implementations, the substrate 102 is a graphite foil or a copper foil or a thin aluminum foil having a thickness below 30 µm, e.g. 10 µm or less. According to some embodiments, which can be combined with other embodiments described herein, metal foils, such as Cu-foils or Al-foils can have a thickness of 5 µm to 20 µm. Graphite foils can include a metal foil, e.g. as described above, with graphite coating a graphite-silicon-coating or a nearly pure Si coating on at least one side and particularly on both sides. The coating can be, for example, 20 µm to 50 µm.

The small thickness of the substrate results in that the substrate will face sudden temperature changes in different zones with different heat load, i.e. the substrate will heat up quickly by which the substrate expands and also cool down quickly by which the substrate is contracted. These sudden temperature changes result in tensions, stresses and stretching causing damage and/or wrinkles in the substrate.

FIG. 1 shows a material deposition apparatus 100 or a corresponding processing system. The material deposition apparatus 100 includes a vacuum chamber 105. A processing drum 120 is provided in the vacuum chamber 105. The substrate 102, for example, a flexible web or foil such as a graphite foil is guided over the processing drum 124 processing of the substrate 102. The substrate 102 is guided along the substrate transport direction D over a roller 125. The roller guides the substrate towards the processing drum 120. The substrate is processed on the processing drum 120. For example, one or more evaporation source is 110 can be provided along the substrate guiding path on the processing drum 120. FIG. 1 shows two evaporation sources 110. The evaporation sources may deposit material on the substrate. According to embodiments of the present disclosure, particularly a lithium containing film can be deposited on a substrate, such as a graphite substrate.

Uncontrolled temperature changes of the substrate may result in wrinkles that deteriorate the thin film deposited on the substrate. According to embodiments of the present disclosure, heaters are provided in dedicated heating zones for controlling the substrate temperature in order to reduce generation of wrinkles of the substrate.

A first heater assembly 140 including one or more first heaters 142 is provided. The first heater assembly provides a first heating zone. The first heating zone or the first heater assembly, respectively is provided in a free-span area of the substrate 102 between the roller 125 and the processing drum 120. Each first heater of the first heater assembly is connected to a controller 130 by control lines 132.

A second heater assembly 160 including one or more second heaters 162 is provided. The second heater assembly provides a second heating zone, for example, a transition heating zone between the first heating zone and a third heating zone. The third heating zone can be provided by the third heater assembly 170 including one or more third heaters 172. The third heating zone can be a high-power heating zone. The high-power heating zone is adjacent the one or more evaporation sources 110. Further, according to some embodiments, which can be combined with other embodiments described herein, a roller heater 131 may be provided. The roller heater is configured to heat the surface of the roller. The substrate is heated by the roller heater while being guided by the roller 125.

The term "heater assembly" as used throughout the present disclosure may be understood as an assembly, unit or apparatus that may include one or more heaters. For example, the heating assembly may include at least one heater or may include two or even more heaters.

The "heater" as used throughout the present disclosure may be graphite heater. Graphite heaters are advantageous since they provide high operating temperatures of, e.g., temperatures in the range of 500° C. to 1800° C. or even above and a high emissivity of, e.g., range of 0.8 to 0.9 or above which allows to realize a high-power density on the substrate. The heating element may also include radiation shields in order to concentrate the power in the direction to the substrate. According to some embodiments, which can be combined with other embodiments described herein, a heater can include a light source or can be a light source. The wavelength of the light source can range from infrared (IR) to ultraviolet (UV), particularly depending on the substrate to be heated. Some substrate materials may be sensitive to UV. Other substrate materials may be sensitive to IR.

According to embodiments of the present disclosure, a plurality of temperature sensors 152 are provided. The temperature sensors 152 are distributed along the substrate transportation path. Particularly, a temperature sensor can be correlated with a start of a heating zone. Additionally, or alternatively, a temperature sensor can be correlated with an end of a heating zone. The temperature sensors, such as thermocouples or pyrometers, i.e. a temperature sensor measuring the thermal radiation of the substrate. The temperature sensors 152 can be connected to the controller 130 by signal lines 134. The signal lines 134 provide a temperature signal to the controller 130. For example, one or more transition temperature sensors can be provided in the transition heating zone, wherein a temperature dependent substrate heating is provided.

Embodiments of the present disclosure provide heating zones with specific temperature control characteristics. Particularly, the first heating zone provided between the roller 125 in the processing drum 120 is a speed dependent heating zone. A substrate speed sensor 151, which may be provided at the processing drum 120 or the roller 125, provides a speed signal over the signal line 122. The signal line 122 is shown at the processing drum 120 in FIG. 1. However, the signal line 122 may also be provided at the roller 125 or at another position in the material deposition apparatus 100. For example, the substrate speed can be provided at an unwinding spool of a material deposition system, a winding spool of a material deposition, or another position in a material deposition system.

The third heating zone or the high-power heating zone can be provided with a constant heating, i.e. a constant power mode or can be provided with a heating dependent on the evaporation rate. Particularly, the temperature control in the third heating zone is independent of the substrate speed and the substrate temperature may also be controlled at a standstill of the substrate while the substrate is provided on the processing drum 120. According to some embodiments, which can be combined with other embodiments described herein, the third heating zone can be controlled depending on the evaporation rate, i.e. the energy provided towards the substrate by the evaporation sources. As sudden temperature change of the substrate during material deposition can be reduced or avoided by having the third heaters 172 provided adjacent to the evaporation sources 110, for example, upstream of evaporation sources, between evaporation sources, and/or downstream of evaporation sources, providing the same heating to the substrate as compared to the evaporation sources.

The second heating zone or the transition heating zone is provided between the first heating zone and the third heating zone. The second heating zone can be provided shortly before the substrate comes into contact with the processing drum, for example, a cooled gas cushion drum. The second heating zone is a temperature dependent heating zone with a temperature control dependent on the substrate temperature after the first heating zone. Additionally, the temperature control in the second heating zone can be dependent on the temperature in the third heating zone. For example, FIG. 1 shows two temperature sensors between the first heating zone and the second heating zone for improved temperature control after the speed dependent first temperature zone.

According to some embodiments, which can be combined with other embodiments described herein, the temperature control of the substrate in a free-span area between the roller 125 and the processing drum 120 is provided by a first temperature zone with a speed dependent control and may partly be provided by a second temperature zone with a temperature dependent control. The speed dependent control in the first heating zone allows for the continuous increase of the substrate temperature between the roller 125 and the second heating zone. The second heating zone raises the temperature to the final temperature in the deposition area. Particularly, the substrate temperature is raised to the final deposition temperature before the substrate comes in contact with the processing drum. The second heating zone is temperature dependent. The second heating zone, i.e. a transition heating zone, can be provided partly in a free-span-zone and partly on the drum. Particularly, the second heating zone provides the energy appropriate for substrate heating of the substrate temperature after the first heating zone to the substrate temperature for material deposition. The third heating zone or high-power heating zone maintains the substrate temperature at the processing temperature while the substrate is in contact with the processing drum.

For example, the roller 125 may beat the substrate from room temperature to a first temperature of 30° C. to 50° C., e.g. about 40° C. The roller can heat the substrate by the roller heater 131. The one or more first heaters in the first heating zone heat the substrate from the first temperature to a second temperature of 60° C. to 80° C., e.g. about 70° C. The heater control of the first heaters in the first heating zone is speed dependent, i.e. depends on the substrate speed. For a substrate temperature during deposition, i.e. a third temperature of 70° C. to 90° C., e.g. about 80° C., the one or more second heaters in the second heating zone, i.e. a transition heating zone, heat the substrate to provide for the temperature difference of the second temperature at the end of the first heating zone to the third temperature for substrate processing. Particularly, the third temperature can be provided before the substrate comes in contact with the processing drum. The substrate is maintained at the third temperature in the third heating zone, i.e. while the substrate is in contact with the processing drum.

Embodiments of the present disclosure provide one or more controllers and/or one or more control algorithms for temperature control of a substrate, for example a foil, on a processing drum such as a gas cushion drum. After the substrate comes in contact with the processing drum, the substrate temperature is kept essentials constant, particularly regardless of the web speed, even at standstill. According to some embodiments, which can be combined with other embodiments described herein, a graphite foil can be coated with a thin film, for example, a lithium containing thin-film. The temperature control in zones according to embodiments of the present disclosure control the thermal expansion of the substrate and, thus, reduces generation of wrinkles.

According to embodiments of the present disclosure, a speed dependent pre-heating of the substrate is provided before the substrate comes in contact with the processing drum. According to an embodiment, a material deposition apparatus for depositing an evaporated material onto a substrate is provided. The material deposition apparatus includes a processing drum having a cooler configured to control a substrate temperature during processing of a substrate on the processing drum and a roller guiding the substrate towards the processing drum. A first heater assembly is positioned to heat the substrate in a free-span area between the roller and the processing drum. A second heater assembly is positioned to heat the substrate while being supported on the processing drum. At least one deposition source is provided along a substrate transport path downstream of the second heater assembly. The material deposition apparatus includes a substrate speed sensor providing a speed signal correlating with a substrate transportation speed and a controller having an input for the speed signal configured to control at least the first heater assembly. According to some embodiments, a sensor for measuring the temperature of the processing drum 120, e.g. a cooled coating drum, can be provided. According to some embodiments, which can be combined with other embodiments described herein, the controller may have an input for the speed signal, substrate temperature and deposition rate and the controller can be configured to control at least the first heater assembly.

Accordingly, embodiments reduce this thermal expansion of the substrate, for example a foil, on the processing drum. Wrinkles can be reduced or avoided. The substrate temperature for deposition, for example, for coating with lithium, is reached before the substrate comes in contact with the processing drum, for example, a cooled processing drum. The heaters in the free-span area, particularly the heaters of the first heater assembly have a temperature control scheme that is dependent on substrate speed. In light of the small heat dissipation from the substrate, low power values, for example, in the range of 400 W/m$^2$ to 5 kW/m$^2$ can be provided by the first heater assembly. According to some embodiments, which can be combined with other embodiments described herein, the web speed can be 1 m/min or more and/or 12 m/min or below.

For further improvement of the substrate temperature before the substrate contacts the processing drum, a transition heater assembly is provided. The transition heater assembly has the control scheme based on a temperature difference of a temperature after the first heater assembly and the deposition temperature. Particularly, the temperature for deposition is reached before the substrate contacts the processing drum. According to some embodiments, which can be combined with other embodiments described herein, the temperature control of the substrate is independent on the substrate speed in the third heating zone. Particularly, the processing drum is a cooled processing drum. Accordingly, the ratio of heat energy supplied to the substrate and the heat energy dissipated by the cooled processing drum can be provided to have an equilibrium independent on the substrate speed. Accordingly, the heating power of the second heater assembly can be provided with a control scheme depending on deposition rate, i.e. a deposition rate signal provided to a controller.

Figure 2:
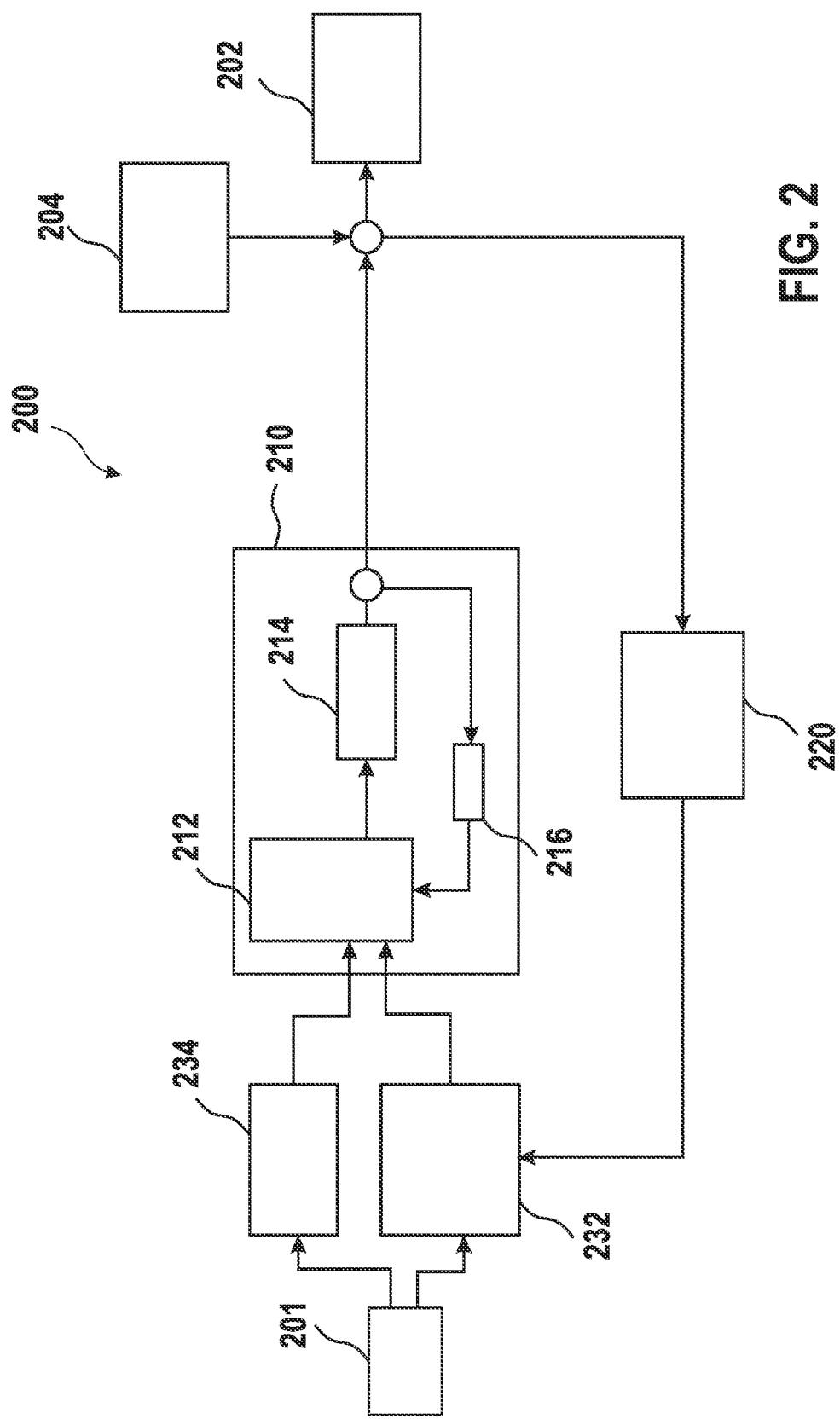
FIG. 2 shows a schematic view of a controller for a heater in a deposition system according to embodiments described herein.

FIG. 2 shows a control loop 200 according to embodiments of the present disclosure. The control loop 200 is particularly utilized for the first heating zone with an input depending on the substrate speed. A control loop 200 may additionally be used for other heating zones, wherein the external input may be temperature independent as described according to embodiments of the present disclosure.

A switch 201 is provided to switch between and automated controller 232 and the manual controller 234. The automated controller or the manual controller provide the signal to the closed heater control 210. The closed heater control 210 includes a loop controller 212 providing a signal to the heater 214. A temperature sensor 216, such as a pyrometer or a thermocouple, provides feedback to the loop controller. Accordingly, a closed loop control for the heater is provided. According to some embodiments, which can be combined with other embodiments described herein, a closed heater control 210 can be provided for each of the heaters. Alternatively, two or more of the heaters may have a common closed heater control.

A control output 202 is provided by the control loop 200. FIG. 2 schematically shows the substrate 204. The substrate 204 provides an external control characteristics for the control loop 200. An external parameter 220 is provided for the control loop 200. According to embodiments of the present disclosure, the external parameter 220 is a substrate speed for control of the first heater assembly. A substrate speed sensor can be provided. The substrate speed sensor provides a speed signal provided at an input of a controller. The controller controls the first heater assembly based on the signal from the substrate speed sensor. The external parameter is provided, for example, to the automated controller 232.

According to some embodiments, which can be combined with other embodiments described herein, in case of the free span heaters 142, the external parameter 220 can additionally or alternatively be a disturbance function which will be influenced by substrate type and substrate speed. For example, there can be a interpolation function based on lookup table in the automated controller 232 that works on these modified disturbance and alter the setpoints in the closed loop controller 210.

According to some embodiments, which can be combined with other embodiments described herein, a control loop 200 with an external parameter 220 being the deposition rate and/or the power provided for the evaporation sources can be provided for control of the second heater assembly positioned to heat the substrate while being supported on the processing drum.

According to some embodiments, which can be combined with other embodiments described herein, additionally the deposition rate can be read from the evaporating apparatus 110, which may be measured by various methods. This control can cascade the external parameter 220 and influence the automated controller to adjust setpoints in closed loop controller 210 and modify the control output 202 for heaters 172

According to some embodiments, which can be combined with other embodiments described herein, a control loop 200 with an external parameter 220 being the first temperature and the second temperature (or a temperature difference) can be provided for control of the transition heater assembly positioned to heat the substrate between the first heater assembly and the second heater assembly.

According to some embodiments, which can be combined with other embodiments described herein, a deposition apparatus and/or a material deposition system, e.g. a vacuum deposition system, may include one or more controllers as exemplarily shown in FIGS. 1 and 2. The one or more controllers can be a common controller having inputs to receive signals as described herein or may be a plurality of controllers connected to each other, wherein a single controller can be assigned to an individual heater. The controller(s) can be connected to one or more heaters, to a substrate speed sensor and to one or more temperature sensors. The controller or each of the controllers includes a central processing unit (CPU), a memory and, for example, support circuits. To facilitate control of the temperature control and/or of the substrate processing, the CPU may be one of any form of general-purpose computer processor that can be used in an industrial setting for controlling various chambers and sub-processors. The memory is coupled to the CPU. The memory, or a computer readable medium, may be one or more readily available memory devices such as random-access memory, read only memory, hard disk, or any other form of digital storage either local or remote. The support circuits may be coupled to the CPU for supporting the processor in a conventional manner. These circuits include cache, power supplies, clock circuits, input/output circuitry and related subsystems, and the like. Temperature control instructions and/or substrate processing instructions are generally stored in the memory as a software routine typically known as a recipe. The software routine may also be stored and/or executed by a second CPU (not shown) that is remotely located from the hardware being controlled by the CPU. The software routine, when executed by CPU, transforms the general-purpose computer into a specific purpose computer (controller) that controls the substrate temperature and/or the substrate processing, e.g. the heater power, the deposition power or the like based on one or more input characteristics according to embodiments of the present disclosure. Although the method and/or process of the present disclosure is discussed as being implemented as a software routine, some of the method steps that are disclosed therein may be performed in hardware as well as by the software controller. As such, the invention may be implemented in software as executed upon a computer system, and hardware as an application specific integrated circuit or other type of hardware implementation, or a combination of software and hardware. The controller may execute or perform method of depositing an evaporated material onto a substrate and/or of processing a substrate according to embodiments of the present disclosure.

There can be an associated human-machine-interface (HMI) or visualization and recipe function to implement these control methods. The visualizations allow the operator to specify parameters related to the substrate 202 and the desired temperature of the substrate. The visualization can also hold recipe parameters which could be selection band for simplified control scheme and the recipe internally adjusts all parameters based on few select parameters such as substrate type, deposition rate, drum speed, drum temperature etc.

Figure 3:
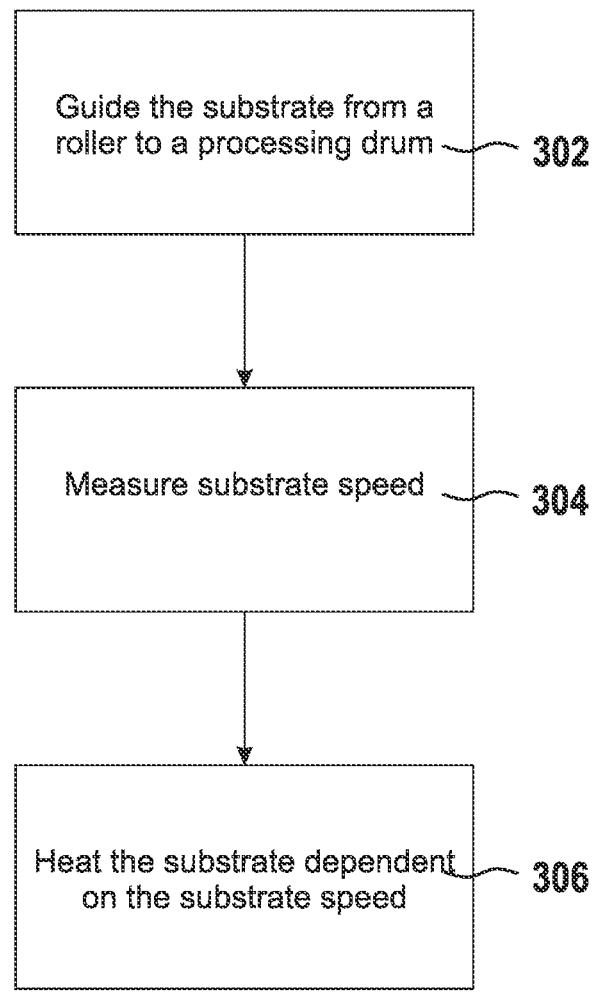
FIG. 3 shows a flow diagram of a method according to embodiments described herein.

According to one embodiment, a method of depositing an evaporated material onto a substrate is provided. As shown in FIG. 3, the method includes guiding the substrate from a roller towards a processing drum as shown by operation 302. As illustrated by operation 304 a substrate speed signal is measured. The substrate is heated with a first heater assembly between the roller and the processing drum dependent on the substrate speed signal, as shown by operation 306 in FIG. 3.

According to some embodiments, which can be combined with other embodiments described herein, the substrate is heated on the processing drum with a second heater assembly dependent on a deposition rate. Additionally, or alternatively, the method further comprises measuring a first substrate temperature signal after heating the substrate with the first heater assembly and measuring a second substrate temperature signal while the substrate is supported on the processing drum and before heating the substrate with the second heater assembly. The substrate can be heated with a transition heater assembly depending on a difference between the first substrate temperature signal and the second substrate temperature signal.

According to some embodiments, which can be combined with other embodiments described herein, a lookup table can be stored in a memory of the controller. Further, a method of depositing an evaporated material on the substrate may include generating a control signal for a heater based on a lookup table. A lookup table may be based on a power density as a function of the substrate speed. Additionally, or alternatively, for example, a heater temperature, for example, a heater temperature of a heater of the first heater assembly can be provided as a function of the power density provided on the substrate. Accordingly, a heater temperature can be provided as a function of the substrate speed. According to yet further implementations, the lookup table can be provided for different substrate materials, for example, a graphite substrate or a copper substrate.

For example, the lookup table may provide values of a substrate speed or a speed of the processing drum, respectively, and values for power density. Alternatively, the power density may be replaced with a heater temperature. According to some embodiments, which can be combined with other embodiments described herein, a bilinear interpolation can be provided for the values in the lookup table. For example, a linear interpolation can be provided for a first value of a substrate speed and a second value of a second substrate speed. These interpolated substrate speed can be utilized for a further linear interpolation for a power density value for a heater temperature, respectively.

According to yet further embodiments, which can be combined with other embodiments described herein, control signals for controlling the various heaters of the heater assemblies may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be a graphics processing unit (GPU), such as those typically used in computer graphics and image processing. A processor may also be implemented as a combination of computing devices, e.g., a combination of a DSP and a microprocessor, a plurality of microprocessors, one or more microprocessors in conjunction with a DSP core, or any other such configuration.

If implemented in software, the functions may be stored or transmitted over as one or more instructions or code on a computer-readable medium. Software shall be construed broadly to mean instructions, data, or any combination thereof, whether referred to as software, firmware, middleware, microcode, hardware description language, or otherwise. Computer-readable media include both computer storage media and communication media, such as any medium that facilitates transfer of a computer program from one place to another. The processor may be responsible for managing bus and general processing, including the execution of software modules stored on the computer-readable storage media.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. A software module may be configured to be trained. The software module may receive training data based on a plurality of measured temperatures and may be trained to provide control date from the training data.

The software to provide a temperature control according to embodiments of the present disclosure may include a machine learning model. To train a machine learning model, such as a CNN model, training data is supplied to a machine learning model to produce output. A machine learning model typically has a set of initialization parameters that affect how the machine learning model processes data. The training data typically has a ground truth (e.g., known value) classification. The output is typically evaluated relative to this ground truth. The result of this evaluation can be used to adjust or update the parameter of the machine learning model so that on a subsequent run the machine learning model produces more accurate output. Once sufficiently trained, the machine learning model accepts input in the same form as the data used to train the machine learning model and produces output based on that input. CNN models that are used to perform temperature control of heaters of one or more heater assemblies are trained using training data consisting of labeled images. The training data may be substrate temperatures at different locations of the vacuum processing system resulting from the various control signals for the heaters of the one or more heater assemblies.

Embodiments of the present disclosure provide one or more of the following advantages. A substrate temperature can be set for various operation conditions, such as substrate speed and/or deposition rate to be adjusted for reduction of wrinkles of the substrate, particularly wrinkles of the substrate on the processing drum. The substrate temperature is adjusted in a free-span area based on the substrate speed, may be adjusted in a transition area on the temperature difference, and may be adjusted on the processing drum depending on the deposition rate (or the power of the deposition source) and the cooling power of the substrate support, for example, a cooled processing drum.

While the foregoing is directed to embodiments of the disclosure, other and further embodiments of the disclosure may be devised without departing from the basic scope thereof, and the scope thereof is determined by the claims that follow.

The invention claimed is:

1. A material deposition apparatus for depositing an evaporated material onto a substrate, the material deposition apparatus comprising:
   a processing drum having a cooler configured to control a substrate temperature during processing of the substrate on the processing drum;
   a roller guiding the substrate towards the processing drum;
   a first heater assembly positioned to heat the substrate in a free-span area between the roller and the processing drum;
   a second heater assembly positioned to heat the substrate while the substrate is supported on the processing drum;
   at least one deposition source provided along a substrate transport path downstream of the second heater assembly;
   a substrate speed sensor providing a speed signal correlating with a substrate transportation speed; and
   a controller having an input for the speed signal configured to control at least the first heater assembly based on the speed signal, the controller further comprising:
      a memory storing computer readable instructions; and
      a processor coupled to the memory, the processor configured by the computer readable instructions that when executed by the processor perform a plurality of operations for depositing the evaporated material onto the substrate, the plurality of operations comprising:
         guiding the substrate from the roller through the free-span area towards the processing drum at the substrate transportation speed;
         receiving the speed signal from the substrate speed sensor;
         heating the substrate from a first substrate temperature to a second substrate temperature with the first heater assembly, based on the speed signal, to provide a speed-dependent heating of the substrate in the free-span area before the substrate comes into contact with the processing drum; and
         depositing the evaporated material onto the substrate using the at least one deposition source as the substrate travels along the substrate transport path on the processing drum.

2. The material deposition apparatus according to claim 1, further comprising:
   a first temperature sensor provided along the substrate transport path downstream of the first heater assembly.

3. The material deposition apparatus according to claim 2, further comprising:
   a second temperature sensor provided along the substrate transport path downstream of the second heater assembly.

4. The material deposition apparatus according to claim 2, further comprising:
   a transition heater assembly positioned to heat the substrate between the first heater assembly and the second heater assembly.

5. The material deposition apparatus according to claim 1, further comprising:
   a second temperature sensor provided along the substrate transport path downstream of the second heater assembly.

6. The material deposition apparatus according to claim 5, further comprising:
   a transition heater assembly positioned to heat the substrate between the first heater assembly and the second heater assembly.

7. The material deposition apparatus according to claim 1, further comprising:

a transition heater assembly positioned to heat the substrate between the first heater assembly and the second heater assembly.

8. The material deposition apparatus according to claim 7, further comprising:
a transition temperature sensor provided along the substrate transport path downstream of the transition heater assembly.

9. The material deposition apparatus according to claim 8, further comprising:
a transition heater controller having an input for a signal from the transition temperature sensor to control the transition heater assembly dependent on the signal of the transition temperature sensor.

10. The material deposition apparatus according to claim 1, further comprising:
a second heater controller having an input for a deposition rate signal.

11. The material deposition apparatus according to claim 1, wherein the cooler is a gas cushion guiding a cooling gas between the processing drum and the substrate.

12. The material deposition apparatus according to claim 1, wherein a lookup table is stored in the memory to correlate the substrate transportation speed with a power density of the first heater assembly.

13. The material deposition apparatus according to claim 12, wherein the controller performs a bilinear interpolation of data in the lookup table to correlate the substrate transportation speed with the power density.

14. The material deposition apparatus according to claim 1, the plurality of operations further comprising:
heating the substrate on the processing drum with the second heater assembly based on a deposition rate.

15. The material deposition apparatus according to claim 14, the plurality of operations further comprising:
measuring a first substrate temperature by receiving a temperature signal from a first temperature sensor after heating the substrate with the first heater assembly, the first temperature sensor provided along the substrate transport path downstream of the first heater assembly; and
measuring a second substrate temperature by receiving a temperature signal from a second temperature sensor while the substrate is supported on the processing drum and before heating the substrate with the second heater assembly, the second temperature sensor provided along the substrate transport path downstream of the second heater assembly.

16. The material deposition apparatus according to claim 15, the plurality of operations further comprising:
heating the substrate with a transition heater assembly depending on a difference between the first substrate temperature and the second substrate temperature.

* * * * *